(12) United States Patent
Aiba

(10) Patent No.: US 7,768,349 B2
(45) Date of Patent: Aug. 3, 2010

(54) TRANSCONDUCTANCE AMPLIFIER

(75) Inventor: Yusuke Aiba, Tokyo (JP)

(73) Assignee: Asahi Kasei Emd Corporation, Tokyo (JP)

( * ) Notice: Subject to any disclaimer, the term of this patent is extended or adjusted under 35 U.S.C. 154(b) by 0 days.

(21) Appl. No.: 12/159,978

(22) PCT Filed: Jul. 26, 2007

(86) PCT No.: PCT/JP2007/064644

§ 371 (c)(1), (2), (4) Date: Jul. 2, 2008

(87) PCT Pub. No.: WO2008/023530

PCT Pub. Date: Feb. 28, 2008

(65) Prior Publication Data

US 2009/0289711 A1    Nov. 26, 2009

(30) Foreign Application Priority Data

Aug. 21, 2006    (JP) .............................. 2006-224293

(51) Int. Cl.
H03F 3/45    (2006.01)
(52) U.S. Cl. ...................................... 330/253; 330/254
(58) Field of Classification Search ................. 330/253, 330/254
See application file for complete search history.

(56) References Cited

U.S. PATENT DOCUMENTS

| | | | |
|---|---|---|---|
| 4,912,425 A | 3/1990 | Kobayashi et al. | |
| 5,703,534 A | 12/1997 | Kim | |
| 6,549,074 B2 | 4/2003 | Ugajin et al. | |
| 7,443,241 B2 * | 10/2008 | Fong et al. | ................... 330/254 |

FOREIGN PATENT DOCUMENTS

| | | |
|---|---|---|
| GB | 2 335 101 | 9/1999 |
| JP | 62-190908 | 8/1987 |
| JP | 1-137808 | 5/1989 |
| JP | 8-242130 | 9/1996 |
| JP | 11-251848 | 9/1999 |

(Continued)

OTHER PUBLICATIONS

Razavi, B., "Design of Analog CMOS Integrated Circuits", Maruzen Co. Ltd., Mar. 30, 2003, pp. 556-560.

(Continued)

*Primary Examiner*—Khanh V Nguyen
(74) *Attorney, Agent, or Firm*—Finnegan, Henderson, Farabow, Garrett & Dunner, LLP

(57) ABSTRACT

An embodiment of the present invention has a differential pair including a first and second MOS transistors having their sources grounded; a third and fourth transistor with their source terminals connected to drain terminals of the first and second transistors, respectively; a voltage generating circuit for outputting tuning and common voltage so that the ratio between the common and tuning voltage is constant; and a differential pair input voltage generating circuit that receives the input and common voltage to output voltages Vip and Vin to gate terminals of the first and second transistors, respectively. The gate terminal of the fourth transistor is connected to the gate terminal of the third transistor, and the tuning voltage is input to the two terminals.

9 Claims, 11 Drawing Sheets

FOREIGN PATENT DOCUMENTS

| | | |
|---|---|---|
| JP | 2000-151302 | 5/2000 |
| JP | 2002-237733 | 8/2002 |
| JP | 2005-354558 | 12/2005 |
| JP | 2006-80649 | 3/2006 |
| WO | WO 2008/023530 | 2/2008 |

OTHER PUBLICATIONS

Kim, Chun-Sup, "A CMOS 4X Speed DVD Read Channel IC", IEEE Journal of Solid-State Circuits, vol. 33, No. 8, pp. 1168-1178, Aug. 1998.

* cited by examiner

TRANSCONDUCTANCE AMPLIFIER

TECHNICAL FIELD

The present invention relates to a transconductance amplifier for converting voltage to current.

BACKGROUND ART

A transconductance amplifier is an amplifier for supplying output current in proportion to input voltage, and has stable gain in general. In other words, when varying input voltage over a predetermined operating input range, the ratio between output current and input voltage is stable, that is, the output current is linear with respect to the input voltage.

As a transconductance amplifier with good linearity between input voltage and output current over a predetermined operating input range, one using a differential pair composed of source grounded MOS transistors as shown in FIG. 1 is known (see Non-Patent Document 1, for example). The transconductance amplifier as shown in FIG. 1 comprises a differential pair composed of source grounded MOS transistors 111 and 112; a MOS transistor 113 with its source terminal connected to a drain terminal of the MOS transistor 111; a MOS transistor 114 with its source terminal connected to a drain terminal of the MOS transistor 112, and its gate terminal connected to a gate terminal of the MOS transistor 113; a voltage generating circuit 100 for outputting tuning voltage Vctrl to be supplied (good?) to the gate terminals of the MOS transistors 113 and 114; a voltage generator for outputting common voltage Vcm for generating voltages Vip and Vin to be input to the differential pair; and a differential pair input voltage generating circuit 120 which receives input voltage Vinput and the common voltage Vcm to supply the voltage Vip to the gate terminal of the MOS transistor 111 and the voltage Vin to the gate terminal of the MOS transistor 112. The transistor size (the ratio between channel width and channel length) of the individual MOS transistors, and the tuning voltage Vctrl and the common voltage Vcm are controlled so as to operate the MOS transistors 111 and 112 constituting the differential pair in triode region, and the MOS transistors 113 and 114 in saturation region. In addition, the voltages Vip and Vin satisfy the relationship $$Vin = 2 \times Vcm - Vip,$$

and the difference between Vip and Vin is determined by Vinput.

In such a configuration, when Vip−Vin is seen as input voltage and Ip−In as output current, the circuit as shown in FIG. 1 functions as a transconductance amplifier. FIG. 2 illustrates the transconductance Gm obtained by differentiating the output current by the input voltage. The transconductance Gm is constant near Vip−Vin=0, and it can be seen that the output current is proportional to the input voltage. In addition to the good linearity between the input voltage and the output current, tuning of the transconductance Gm is possible by controlling the tuning voltage Vctrl. The transconductances Gm under different tuning voltage conditions are shown wherein the tuning voltage Vctrl is varied from a middle level to a small and large level.

In a conventional transconductance amplifier as shown in FIG. 1, however, the linearity between input voltage and output current of the transconductance amplifier deteriorates when the tuning voltage Vctrl is varied for the purpose of tuning transconductance. Assume that the range in which transconductance Gm is constant before tuning (when the Vctrl is middle in the example of FIG. 2) is the operating input range when using the transconductance amplifier. Then, increased tuning voltage Vctrl diminishes the transconductance Gm near the upper limit and lower limit of the operating input range, thereby narrowing the range in which the transconductance Gm is constant. Hence, it would become impossible to supply output current in proportion to input voltage. From a different point of view, to achieve tuning with the linearity between input voltage and output current maintained over the entire operating input range, the range in which the tuning voltage Vctrl is variable for tuning the transconductance is narrowed.

The present invention is directed to the foregoing problem, and an object of the present invention is to provide a transconductance amplifier capable of tuning transconductance in a broader range with the linearity between input voltage and output current maintained over a predetermined operating input range.

Non-Patent Document 1: Chun-Sup Kim, "A CMOS 4× Speed DVD Read Channel IC," IEEE Journal of Solid-State Circuits, vol. 33, No. 8, August 1998.

DISCLOSURE OF THE INVENTION

To accomplish the object, one embodiment of the present invention is a transconductance amplifier for supplying output current in proportion to input voltage, the transconductance amplifier comprising: a differential pair including source grounded first and second MOS transistors operating in triode region; a third MOS transistor that operates in saturation region with a source terminal thereof connected to a drain terminal of the first MOS transistor; a fourth MOS transistor that operates in saturation region with a source terminal thereof connected to a drain terminal of the second MOS transistor and a gate terminal thereof connected to a gate terminal of the third MOS transistor; a voltage generating circuit for outputting a tuning voltage to be input to the gate terminals of the third and fourth MOS transistors and a common voltage for generating first voltage and second voltage to be input to the differential pair, wherein a ratio between the tuning voltage and the common voltage is constant; and a differential pair input voltage generating circuit that receives the common voltage to output the first voltage to the gate terminal of the first MOS transistor and the second voltage to the gate terminal of the second MOS transistor, wherein the second voltage is 2×(the common voltage)−(the first voltage), the input voltage is the difference between the first voltage and the second voltage, and the output current is the difference between a first drain-to-source current of the first and third MOS transistors and a second drain-to-source current of the second and fourth MOS transistors.

In addition, one embodiment of the invention is a transconductance amplifier, wherein the voltage generating circuit comprises: a voltage generator for outputting the tuning voltage; and voltage dividing means for dividing voltage between the output of the voltage generator and a ground to output the divided voltage as the common voltage.

In addition, one embodiment of the invention is a transconductance amplifier according, wherein the voltage dividing means comprises: a plurality of resistors connected in series between the output of the voltage generator and the ground.

In addition, one embodiment of the invention is a transconductance amplifier, wherein the voltage dividing means further comprises: an operational amplifier having a first input terminal thereof connected to an intermediate point of the plurality of resistors, and a second input terminal thereof connected to an output terminal thereof.

In addition, one embodiment of the invention is a transconductance amplifier, wherein the voltage generating circuit comprises: a voltage generator for outputting the common voltage; and a non-inverting amplifier for outputting the tuning voltage, with an input terminal thereof connected to the output terminal of the voltage generator.

In addition, one embodiment of the invention is a transconductance amplifier, wherein the voltage generator comprises: a fifth MOS transistor that operates in triode region and is source grounded; a sixth MOS transistor that operates in saturation region, with a source terminal thereof connected to a drain terminal of the fifth MOS transistor and a drain terminal thereof connected to a gate terminal of the fifth MOS transistor; and a current source for outputting a current to a drain terminal of the sixth MOS transistor, wherein the gate terminal of the fifth MOS transistor is the output terminal of the voltage generator, and a gate terminal of the sixth MOS transistor is connected to an output terminal of the non-inverting amplifier.

In addition, one embodiment of the invention is a transconductance amplifier, wherein the fifth MOS transistor has current mirror relationship with the first and second MOS transistors, and the sixth MOS transistor has current mirror relationship with the third and fourth MOS transistors.

In addition, one embodiment of the invention is a transconductance amplifier, wherein the current source is variable.

In addition, one embodiment of the invention is a transconductance amplifier, wherein the voltage generator is variable.

In addition, one embodiment of the invention is a transconductance amplifier, wherein the ratio between the tuning voltage and the common voltage is a constant $\alpha$.

BEST MODE FOR CARRYING OUT THE INVENTION

The embodiments in accordance with the present invention will now be described with reference to the accompanying drawings.

Embodiment 1

Figure 3:
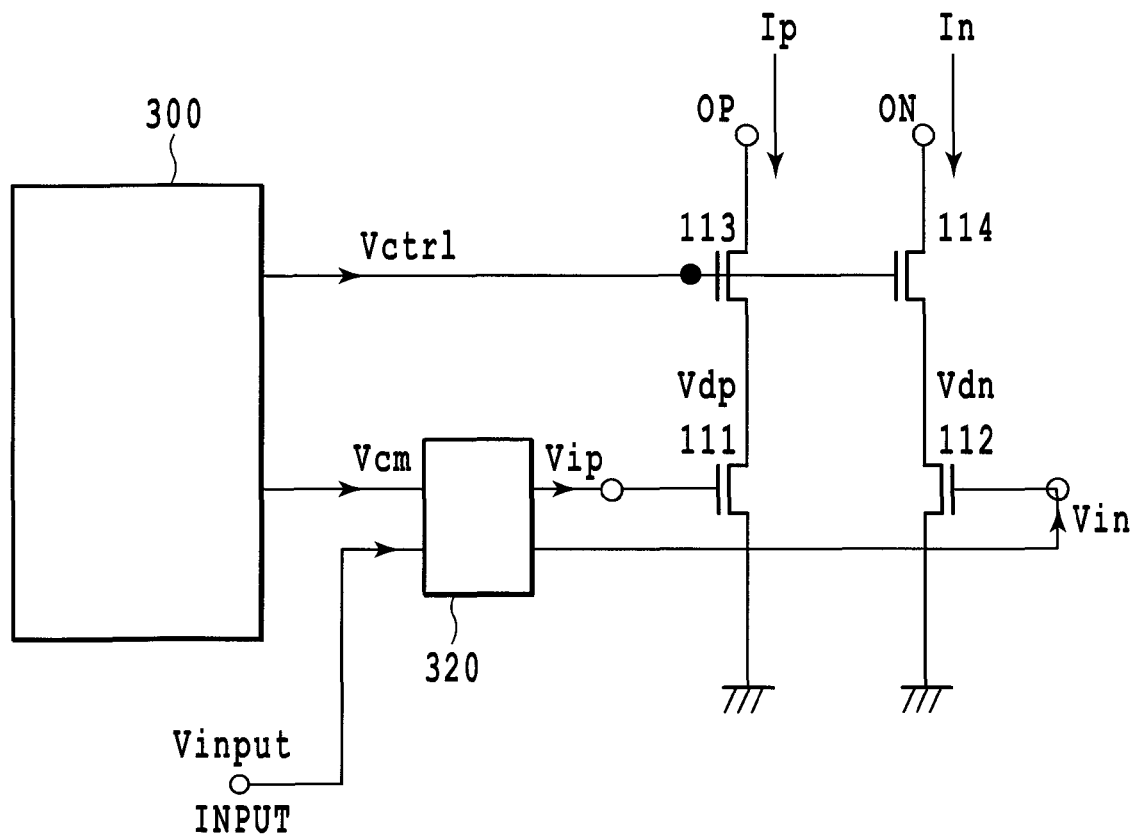
FIG. 3 is a diagram showing the transconductance amplifier of an embodiment 1 in accordance with the present invention.

FIG. 3 shows a circuit diagram of the transconductance amplifier of an embodiment 1. Although the Transconductance Amplifier of the Present embodiment has the same configuration with the conventional transconductance amplifier of FIG. 1 as to the MOS transistors 111-114, it has different configurations in a voltage generating circuit, a voltage generator for outputting common voltage Vcm, and a differential pair input voltage generating circuit. More specifically, the transconductance amplifier of the present embodiment has a differential pair composed of MOS transistors 111 (corresponding to a first MOS transistor) and 112 (corresponding to a second MOS transistor) with their sources grounded; a MOS transistor 113 (corresponding to a third MOS transistor) with its source terminal connected to the drain terminal of the MOS transistor 111; a MOS transistor 114 (corresponding to a fourth MOS transistor) with its source terminal connected to the drain terminal of the MOS transistor 112 and its gate terminal connected to the gate terminal of the MOS transistor 113; a voltage generating circuit 300 for outputting tuning voltage Vctrl to be input to the gate terminals of the MOS transistors 113 and 114, and common voltage Vcm for generating voltage Vip (corresponding to first voltage) and Vin (corresponding to second voltage) to be input to the differential pair; and a differential pair input voltage generating circuit 320 that receives the input voltage Vinput input from the input terminal INPUT and the common voltage Vcm, outputting the voltage Vip to the gate terminal of the MOS transistor 111 and voltage Vin to the gate terminal of the MOS transistor 112. The transistor size of the individual MOS transistors, the tuning voltage Vctrl, and common voltage Vcm are controlled so that the MOS transistors 111 and 112 constituting the differential pair operate in triode region, and the MOS transistors 113 and 114 operate in saturation region.

Figure 10:
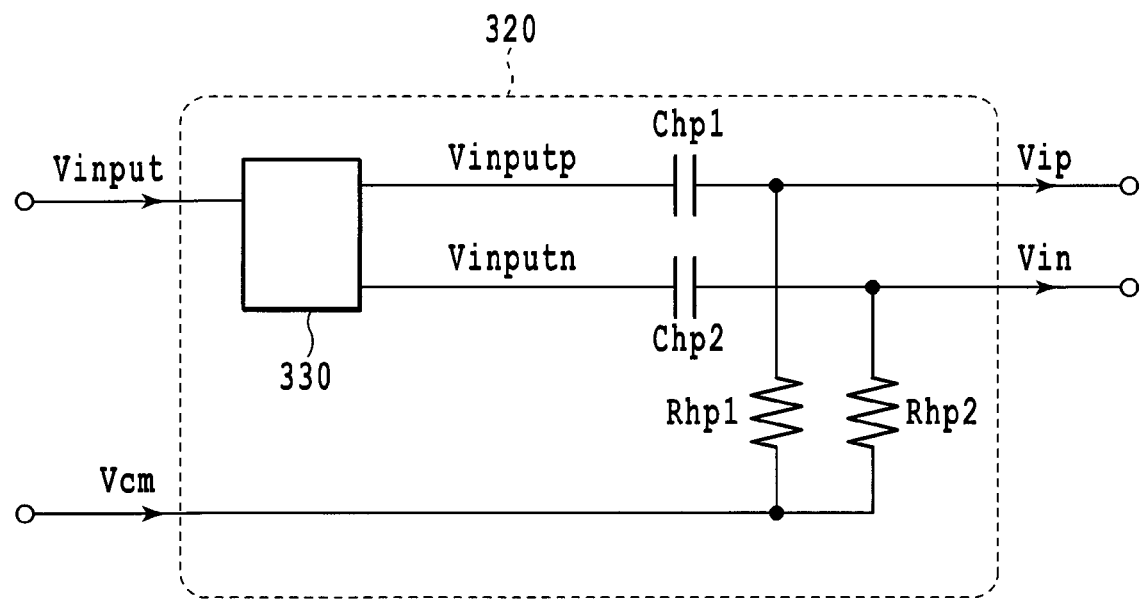
FIG. 10 is a diagram showing an example of the differential pair input voltage generating circuit of an embodiment in accordance with the present invention.

The differential pair input voltage generating circuit 320 can have the configuration shown in FIG. 10, for example. It receives the input voltage Vinput that is substantially equivalent to the difference between the voltage Vip and the voltage Vin (input to the transconductance amplifier) and the common voltage Vcm, and outputs the voltages Vip and Vin to be supplied to the differential pair.

The input voltage Vinput is converted to differential signals Vinputp and Vinputn via a single differential converting circuit 330. These signals are passed through a HPF (high-pass filter) composed of resistors Rhp1 and Rhp2 and capacitors Chp1 and Chp2 and converted to signals having the common voltage Vcm as their reference potential, and then supplied to the gate terminals of the MOS transistors 111 and 112. The voltages to be supplied to the differential pair can be generated directly from the differential signals Vinputp and Vinputn without using the single differential converting circuit 330.

Figure 11:
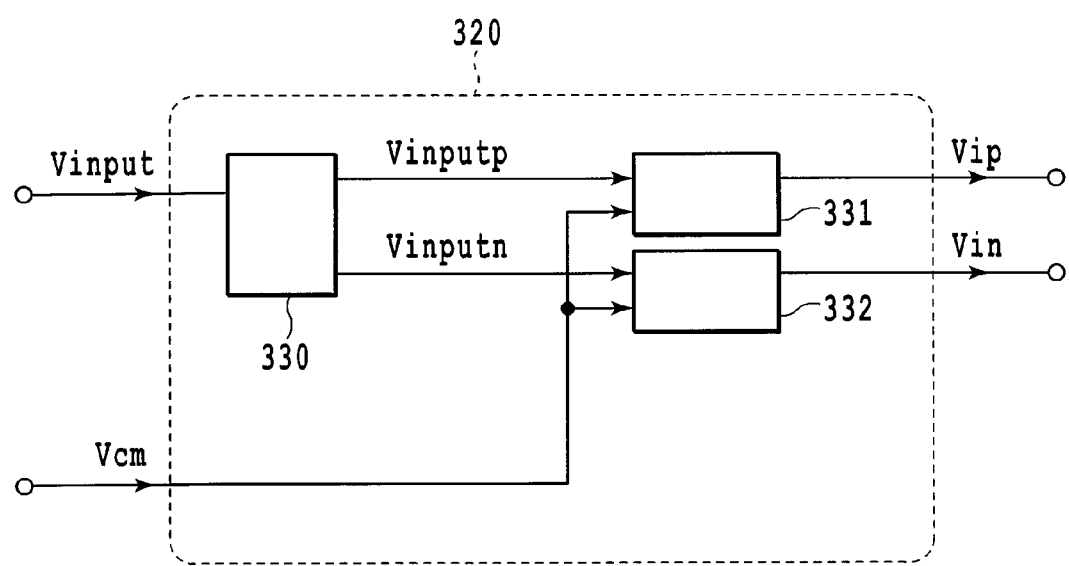
FIG. 11 is a diagram showing another example of the differential pair input voltage generating circuit of an embodiment in accordance with the present invention.

FIG. 11 shows another example of the differential pair input voltage generating circuit 320. It receives the input voltage Vinput that is substantially equivalent to the difference between the voltage Vip and the voltage Vin (input to the transconductance amplifier) and the common voltage Vcm, and outputs the voltages Vip and Vin to be supplied to the differential pair. The input voltage Vinput is converted to the differential signals Vinputp and Vinputn via the single differential converting circuit 330. These signals are passed through level shift circuits 331 and 332 to convert their reference voltage to the common voltage Vcm, and then outputted to the gate terminals of the MOS transistors 111 and 112. The voltages to be supplied to the differential pair can be generated directly from the differential signals Vinputp and Vinputn without using the single differential converting circuit 330. It should be understood by those skilled in the art that the differential pair input voltage generating circuit 320 is not limited to the two examples described above.

In such configurations, consider the difference Vip−Vin between the voltages Vip and Vin generated at the gate terminals of the MOS transistors 111 and 112 as the input voltage, and the difference Ip−In between the currents Ip and In flowing through the drain terminals OP and ON of the MOS transistors 113 and 114 as the output current. Then the circuit shown in FIG. 3 functions as a transconductance amplifier.

Figure 1:
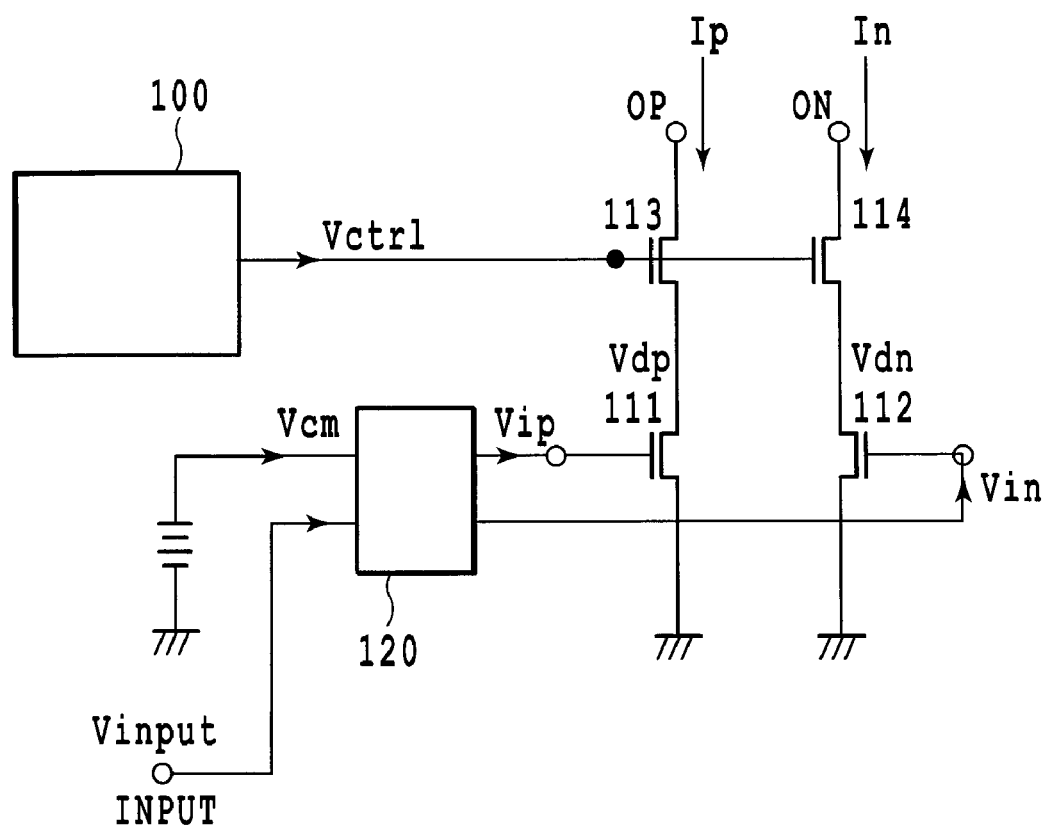
FIG. 1 is a diagram showing a conventional transconductance amplifier.
Figure 2:
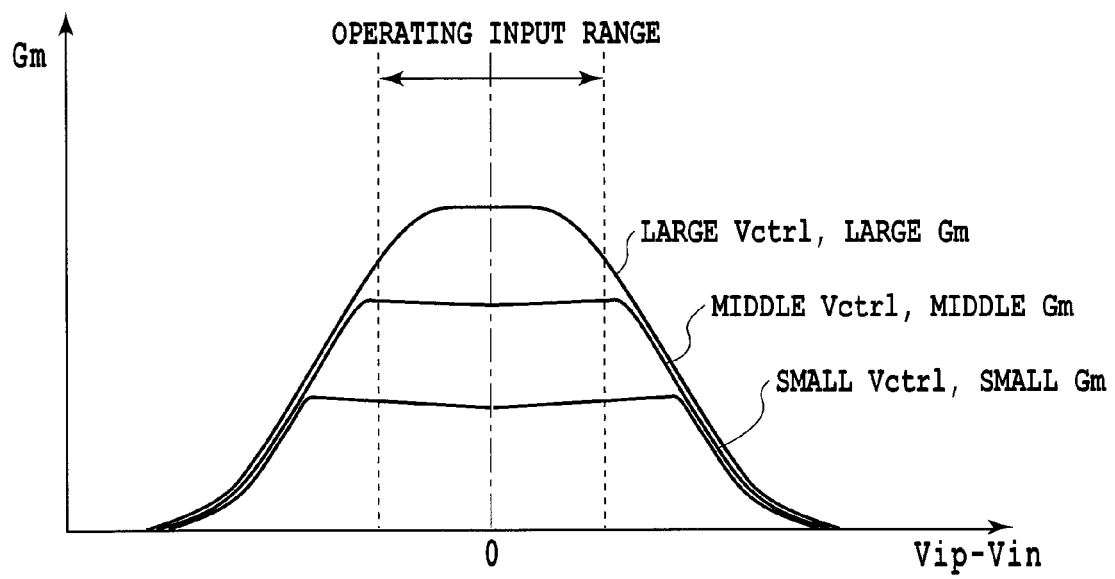
FIG. 2 is a diagram illustrating variations in transconductance when tuning a conventional transconductance amplifier.

The present embodiment differs from the conventional transconductance amplifier as shown in FIG. 1 in that the voltage generating circuit 300 outputs not only the tuning voltage Vctrl but also the common voltage Vcm such that it has a certain relationship with the tuning voltage Vctrl. First, the relationship between the voltage Vip and the tuning voltage Vctrl is explained hereinafter, by paying attention to the MOS transistors 111 and 113. Subsequently, the entire operation of the transconductance amplifier of the present embodiment will be described along with the operation of the MOS transistors 112 and 114.

Figure 4:
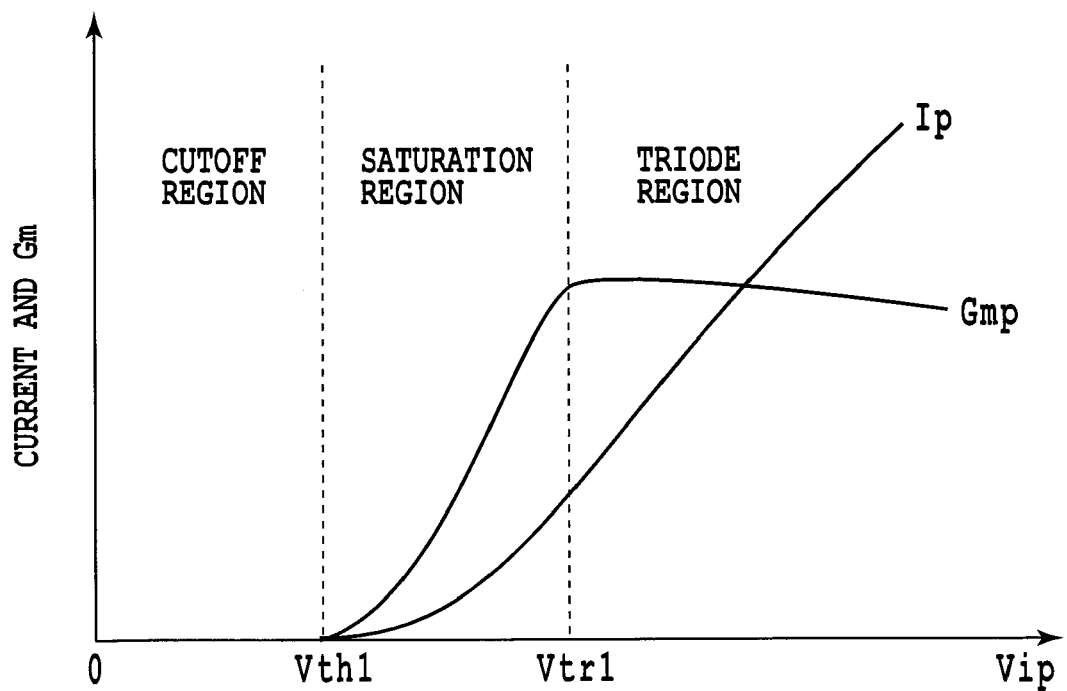
FIG. 4 is a diagram illustrating the operation of a source grounded MOS transistor.

FIG. 4 shows the current Ip against the voltage Vip, and the value obtained by differentiating the current Ip by the voltage Vip, that is, the transconductance Gmp of the MOS transistor 111. In the region where the voltage Vip is from 0 V to the threshold voltage Vth1 of the MOS transistor 111, the current Ip is zero (cutoff region). Expressing the drain voltage of the MOS transistor 111 by Vdp, then in the region where the voltage Vip satisfies Vth1<Vip<Vdp+Vth1, the MOS transistor 111 operates in saturation region where the current Ip satisfies the following equation (1):

$$I_p = k_1 (V_{ip} - V_{th1})^2 \quad (1),$$

where k1 is a coefficient depending on the transistor size and fabrication process. In addition, in the region where the voltage Vip satisfies Vip>Vdp+Vth1, the MOS transistor 111 operates in triode region where the current Ip is given by the following equation:

$$I_p = k_1 \{2(V_{ip} - V_{th1}) \cdot V_{dp} - V_{dp}^2\} \quad (2).$$

If the voltage Vip on the boundary between the saturation region and the triode region is referred to as the boundary voltage Vtr1, $$V_{tr1} = V_{dp} + V_{th1} \quad (3)$$

is satisfied.

Now, paying attention to the MOS transistor 113 operating in the saturation region, the drain voltage Vdp satisfies the relationship of equation (4), which can be transformed to equation (5).

$$I_p = k_3 (V_{ctrl} - V_{dp} - V_{th3})^2 \quad (4)$$

$$V_{dp} = V_{ctrl} - V_{th3} - \sqrt{I_p / k_3} \quad (5)$$

k3 is a coefficient depending on the transistor size and fabrication process, and Vth3 is the threshold voltage of the MOS transistor 113. Substitution of equation (5) into equation (3) gives $$V_{tr1} = V_{ctrl} - V_{th3} - \sqrt{I_p / k_3} + V_{th1} \quad (6).$$

Noting that the current Ip is given by equation (1) at the point where Vip=Vtr1, substitution of equation (1) into equation (6) gives the following equation:

$$V_{tr1} = \frac{1}{1 + \sqrt{k_1 / k_3}} V_{ctrl} - \frac{1}{1 + \sqrt{k_1 / k_3}} V_{th3} + V_{th1}. \quad (7)$$

Defining constants α and β by $$\alpha = \frac{1}{1 + \sqrt{k_1 / k_3}}, \quad \beta = \alpha V_{th3} - V_{th1}, \quad (8)$$

then a relation between the boundary voltage Vtr1 and the tuning voltage Vctrl is given by $$V_{tr1} = \alpha V_{ctrl} - \beta \quad (9)$$

where constants α and β are constants depending on transistor size and fabrication process.

Next, the overall operation of the transconductance amplifier of the present embodiment will be described with reference to FIG. 5.

Figure 5:
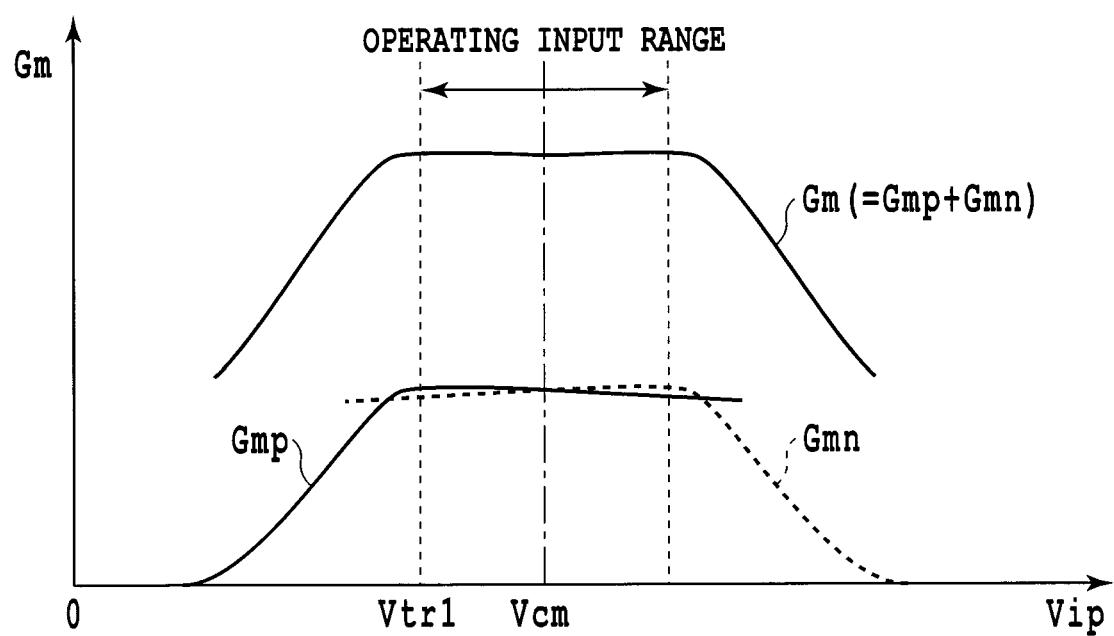
FIG. 5 is a diagram illustrating the operation of a differential pair composed of two source grounded MOS transistors.

FIG. 5 shows, besides the transconductance Gmp, the transconductance Gmn obtained by differentiating the current In by the voltage Vin is shown in a dotted line as a function of Vip. The transconductance Gmn is the reflection of the transconductance Gmp across the common voltage Vcm. The transconductance Gmn as shown in FIG. 5 is obtained by assuming that the MOS transistors 112 and 114 have the same operating characteristics as the MOS transistors 111 and 113 and considering the relationship between Vip and Vin. Here, it should be noted that the common voltage Vcm must be set at Vtr1<Vcm for both the MOS transistors 111 and 112 to operate in triode region.

The transconductance Gm of the whole differential pair composed of the MOS transistors 111 and 112 is given by the sum of Gmp and Gmn when Vip−Vin is seen as input voltage and Ip−In as output current. Accordingly, as shown in FIG. 5, the transconductance Gm of the whole differential pair has a stable, nearly constant value in the range of ±(Vcm−Vtr1) about the common voltage Vcm.

The present embodiment of the transconductance amplifier is characterized by controlling not only the tuning voltage Vctrl but also the common voltage Vcm, when tuning transconductance. More specifically, the voltage generating circuit 300 adjusts the common voltage so that the ratio between the common voltage and the tuning voltage is constant. Calculating from equation (9), Vcm−Vtr1 can be represented by the following equation:

$$V_{cm} - V_{tr1} = V_{ctrl} \left( \frac{V_{cm}}{V_{ctrl}} - \alpha \right) + \beta. \quad (10)$$

From equation (10), it is found that selecting the ratio between the common voltage Vcm and the tuning voltage Vctrl at an appropriate constant close to the constant α reduces the effect of the tuning voltage Vctrl on Vcm−Vtr1. Namely, even if the tuning voltage Vctrl is varied for the tuning of transconductance, the linearity between the input voltage and the output current can be maintained over the entire operating input range determined before the tuning.

Figure 6:
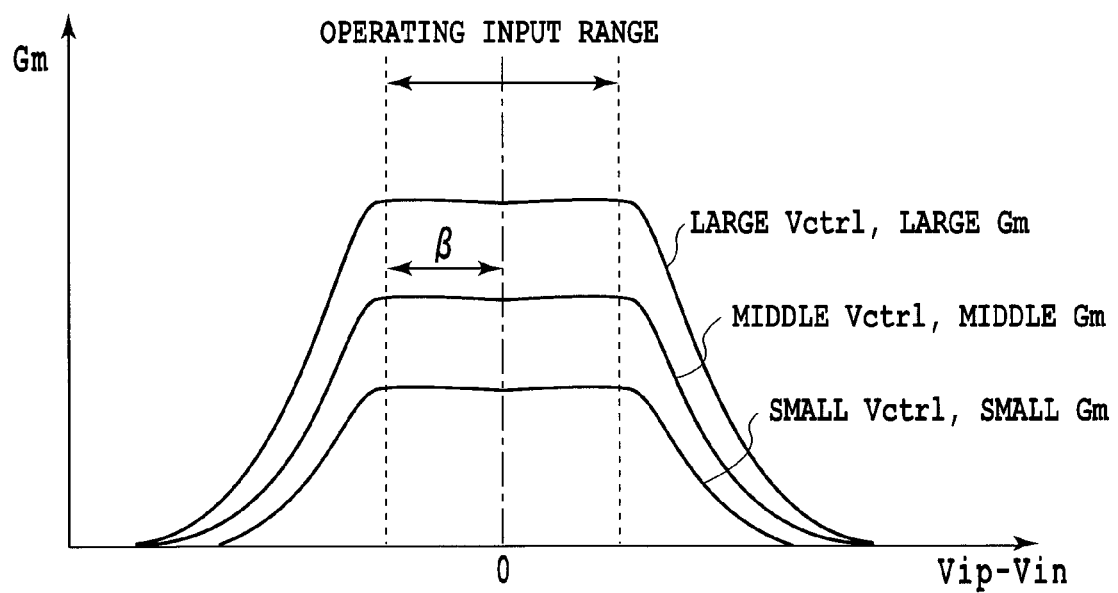
FIG. 6 is a diagram illustrating variations in the transconductance when tuning the transconductance amplifier of an embodiment in accordance with the present invention.

In particular, if the voltage generating circuit 300 is adjusted to satisfy $$\frac{V_{cm}}{V_{ctrl}} = \alpha, \quad (11)$$

substitution of equation (11) into equation (10) gives $$V_{cm} - V_{tr1} = \beta \quad (12)$$

which means that the effect of the tuning voltage Vctrl on Vcm−Vtr1 can be eliminated as shown in FIG. 6. Thus, the tuning voltage Vctrl can be varied in a wide range for the tuning of transconductance while maintaining the linearity between the input voltage and the output current over the entire predetermined operating input range.

Here, the constant α is uniquely determined by the ratio between k1 and k3 as shown by equation (8). The coefficients k1 and k3 are coefficients depending on transistor size and fabrication process and are represented by the product of the two. As for the ratio of the sizes of the MOS transistors 111 and 113, considering that they are formed on the same chip, it is free from the effect of the variations in the fabrication process and is nearly fixed. In addition, as for the ratio between the coefficients depending on the fabrication process, considering that the same kind of the transistors are used which are formed on the same chip, it is nearly fixed without suffering the effect of the fabrication process variations. In addition, it does not depend on the operating temperature conditions. Thus, the ratio between k1 and k3 becomes a stable value invariable by the fabrication process variations or the operating temperature conditions. Accordingly, it is found that the constant α adjusted by the voltage generating circuit 300 is a stable constant free from the changes forced by the fabrication process variations or operating temperature conditions.

As described above, the transconductance amplifier in accordance with the present invention is characterized by controlling not only the tuning voltage Vctrl but also the common voltage Vcm, when tuning transconductance. More specifically, it is characterized by constructing the voltage generating circuit so that the ratio between the common voltage Vcm and the tuning voltage Vctrl is constant. This reduces the effect of the tuning voltage Vctrl on Vcm−Vtr1, thereby providing the transconductance amplifier capable of tuning the transconductance in a wider range.

In particular, constructing the voltage generating circuit so that the ratio between the common voltage Vcm and the tuning voltage Vctrl equals the constant α enables eliminating the effect of the tuning voltage Vctrl on Vcm−Vtr1, thereby providing the transconductance amplifier tunable in a very wide range.

Embodiment 2

Figure 7:
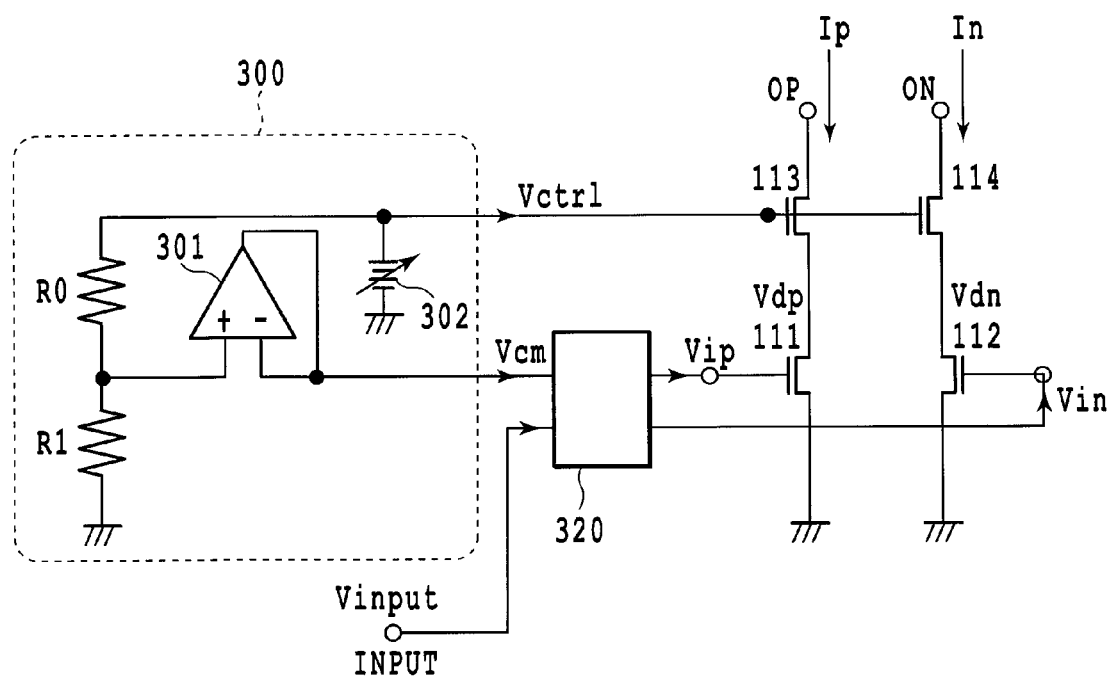
FIG. 7 is a diagram showing the transconductance amplifier of an embodiment 2 in accordance with the present invention.

FIG. 7 shows a circuit diagram of the transconductance amplifier of an embodiment 2. The present embodiment specifies the configuration of the voltage generating circuit 300 of the embodiment 1, and the remaining configuration is the same. More specifically, the voltage generating circuit 300 of the present embodiment includes a voltage generator 302, resistors R0 and R1 connected in series between the output of the voltage generator 302 and a ground, and an operational amplifier 301 with its first input terminal connected to the connecting point of the resistors R0 and R1, and its second input terminal connected to its output terminal. The resistors R0 and R1 are not limited to a resistive material that is formed on the chip and consists of polysilicon. For example, resistors can be metal wirings or MOS transistors operating in triode region. The tuning voltage Vctrl is the output of the voltage generator 302, and the common voltage Vcm is the output of the operational amplifier 301. Determining the output voltage of the voltage generator 302 at a desired value enables the tuning voltage Vctrl and the common voltage Vcm to be set at desired values. In this case, the output voltage of the voltage generator 302 can be made variable, or can be fixed after setting the tuning voltage Vctrl and the common voltage Vcm at their desired values.

With such a configuration, the transconductance amplifier is characterized by that the resistance ratio between the resistor R0 and the resistor R1 is constant. The voltage generating circuit 300 is constructed to make the ratio between the common voltage Vcm and the tuning voltage Vctrl constant. Selecting the ratio between the common voltage Vcm and the tuning voltage Vctrl at an appropriate constant close to the constant α, the effect of the tuning voltage Vctrl on Vcm−Vtr1 can be reduced according to the relationship shown by equation (10). This makes it possible to provide a transconductance amplifier capable of tuning transconductance in a wider range. In particular, setting the resistance ratio between the resistor R0 and the resistor R1 at (1−α):α enables the voltage ratio between the common voltage Vcm and the tuning voltage Vctrl to be equal to the constant α. This enables eliminating the effect of the tuning voltage Vctrl on Vcm−Vtr1, thereby providing a transconductance amplifier capable of tuning transconductance in a very wide range.

Although the present embodiment divides the voltage with the two resistors and the single operational amplifier (voltage follower), and outputs the divided voltage as the common voltage Vcm, it should be noted that the voltage dividing means for dividing the voltage between the output of the voltage generator and the ground to output the divided voltage as the common voltage Vcm is not limited to the foregoing means. The voltage dividing means can be a means that has a plurality of resistors connected in series between the output of the voltage generator and the ground, and an operational amplifier with its first input terminal connected to an intermediate point dividing the plurality of resistors into two parts, and its second input terminal connected to its output terminal. Alternatively, the voltage divided by the resistors can be used as the common voltage Vcm without the operational amplifier.

Embodiment 3

Figure 8:
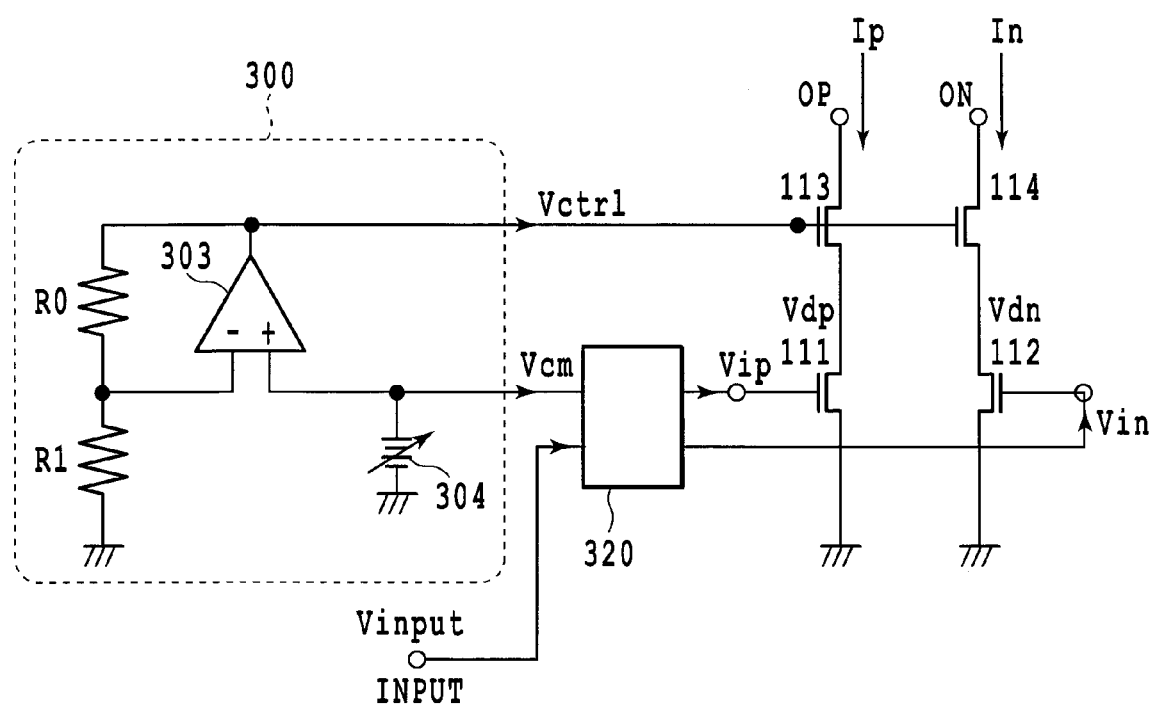
FIG. 8 is a diagram showing the transconductance amplifier of an embodiment 3 in accordance with the present invention.

FIG. 8 shows a circuit diagram showing the transconductance amplifier of an embodiment 3. The present embodiment specifies the configuration of the voltage generating circuit 300 of the embodiment 1, and the remaining configuration is the same. More specifically, the voltage generating circuit 300 includes a voltage generator 304, and a non-inverting amplifier with its input terminal connected to the output terminal of the voltage generator 304. The non-inverting amplifier is composed of an operational amplifier 303, a resistor R0 and a resistor R1. The resistors R0 and R1 are not limited to a resistive material that is formed on the chip and consists of polysilicon. For example, resistors can be metal wirings or MOS transistors operating in triode region. The tuning voltage Vctrl is the output from the non-inverting amplifier, and the common voltage Vcm is the output from the voltage generator 304. Determining the output voltage of the voltage generator 304 at a desired value enables the common voltage Vcm and the tuning voltage Vctrl to be set at desired values. In this case, the output voltage of the voltage generator 304 can be made variable, or can be fixed after setting the common voltage Vcm and the tuning voltage Vctrl at their desired values.

With such a configuration, the transconductance amplifier is characterized by that the resistance ratio between the resistor R0 and the resistor R1 is constant. The voltage generating circuit 300 is constructed to make the ratio between the common voltage Vcm and the tuning voltage Vctrl constant. Selecting the ratio between the common voltage Vcm and the tuning voltage Vctrl at an appropriate constant close to the constant α, the effect of the tuning voltage Vctrl on Vcm−Vtr1 can be reduced according to the relationship shown by equation (10). This makes it possible to provide the transconductance amplifier capable of tuning the transconductance in a wider range. In particular, setting the resistance ratio between the resistor R0 and the resistor R1 at (1−α):α enables the voltage ratio between the common voltage Vcm and the tuning voltage Vctrl to be equal to the constant α. This enables eliminating the effect of the tuning voltage Vctrl on Vcm−Vtr1, thereby providing the transconductance amplifier capable of tuning the transconductance in a very wide range.

Embodiment 4

Figure 9:
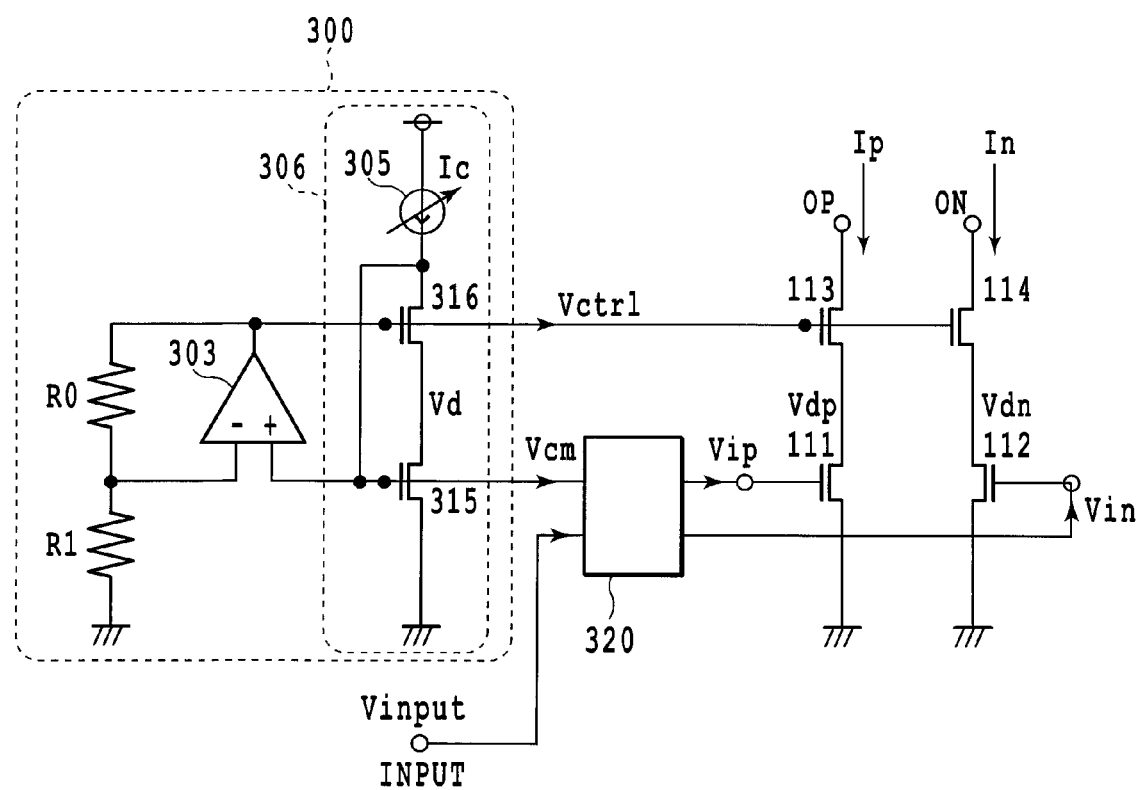
FIG. 9 is a diagram showing the transconductance amplifier of an embodiment 4 in accordance with the present invention.

FIG. 9 shows a circuit diagram showing the transconductance amplifier of an embodiment 4. The present embodiment has the same configuration as the embodiment 3 except that the voltage generator 304 of FIG. 8 is replaced by the voltage generator 306 of FIG. 9. The voltage generating circuit 300 of the present embodiment includes the voltage generator 306, and the non-inverting amplifier with its input terminal connected to the output terminal of the voltage generator 306, wherein the voltage generator 306 includes a source grounded MOS transistor 315 (corresponding to a fifth MOS transistor), a MOS transistor 316 (corresponding to a sixth MOS transistor) with its source terminal connected to the drain terminal of the MOS transistor 315 and its drain terminal connected to the gate terminal of the MOS transistor 315, and a current source 305 for supplying a current to the drain terminal of the MOS transistor 316; the gate terminal of the MOS transistor 315 constitutes the output terminal of the voltage generator 306; and the gate terminal of the MOS transistor 316 is connected to the output terminal of the non-inverting amplifier. The tuning voltage Vctrl is the output from the non-inverting amplifier, and the common voltage Vcm is the output from the voltage generator 306. Determining the output current of the current source 305 at a desired value enables the output of the voltage generator 306 to be set at a desired value, and the tuning voltage Vctrl and the common voltage Vcm to be set at desired values. In this case, the output current of the current source 305 can be made variable, or can be fixed after setting the output current of the current source 305 in such a manner that the tuning voltage Vctrl and the common voltage Vcm become their desired values.

As for the MOS transistors 315 and 316, their transistor sizes can be determined so that they have current mirror relationships with the MOS transistors 111 and 112 and with the MOS transistors 113 and 114, respectively. For example, assume that the current mirror ratio is γ and the current of the fixed current source 305 is Ic, then the MOS transistors 315 and 316 can be arranged in such a manner that when Vip=Vin=Vcm, the expressions Ip=γ×Ic and In=γ×Ic hold.

With such a configuration, the transconductance amplifier is characterized by that the resistance ratio between the resistor R0 and the resistor R1 is constant as in the transconductance amplifier of the embodiment 3. In addition, the voltage generating circuit 300 is constructed so as to make the ratio between the common voltage Vcm and the tuning voltage Vctrl constant. Selecting the ratio between the common voltage Vcm and the tuning voltage Vctrl at an appropriate constant close to the constant α, the effect of the tuning voltage Vctrl on Vcm−Vtr1 can be reduced according to the relationship shown by equation (10). This makes it possible to provide the transconductance amplifier capable of tuning the transconductance in a wider range. In particular, setting the resistance ratio between the resistors R0 and R1 at (1−α):α enables the voltage ratio between Vcm and Vctrl to be equal to the constant α. This enables eliminating the effect of the tuning voltage Vctrl on Vcm−Vtr1, thereby providing the transconductance amplifier capable of tuning the transconductance in a very wide range.

In addition, the transconductance amplifier of the present embodiment has a characteristic of being able to determine the currents Ip and In flowing through the MOS transistors 111 and 112 constituting the differential pair directly according to the current mirror ratio based on the current source 305.

The invention claimed is:

1. A transconductance amplifier for supplying output current in proportion to input voltage, said transconductance amplifier comprising:
a differential pair including source grounded first and second MOS transistors operating in triode region;
a third MOS transistor that operates in saturation region with a source terminal thereof connected to a drain terminal of said first MOS transistor;
a fourth MOS transistor that operates in saturation region with a source terminal thereof connected to a drain terminal of said second MOS transistor and a gate terminal thereof connected to a gate terminal of said third MOS transistor;
a voltage generating circuit for outputting tuning voltage to be input to gate terminals of said third and fourth MOS transistors, and common voltage for generating first voltage and second voltage to be input to said differential pair in such a manner that a ratio between the tuning voltage and the common voltage is constant; and
a differential pair input voltage generating circuit that receives the common voltage, outputting the first voltage to the gate terminal of said first MOS transistor and the second voltage to the gate terminal of said second MOS transistor, wherein the second voltage equals 2×(the common voltage)−(the first voltage);

the input voltage equals the difference between the first voltage and the second voltage; and the output current equals the difference between a first drain-to-source current of said first and third MOS transistors and a second drain-to-source current of said second and fourth MOS transistors.

2. A transconductance amplifier according to claim 1, wherein said voltage generating circuit comprises:
a voltage generator for outputting the tuning voltage; and
voltage dividing means for dividing voltage between an output of said voltage generator and a ground to output the divided voltage as the common voltage.

3. A transconductance amplifier according to claim 2, wherein said voltage dividing means comprises:

a plurality of resistors connected in series between the output of said voltage generator and the ground.

4. A transconductance amplifier according to claim 3, wherein said voltage dividing means further comprises:
an operational amplifier with a first input terminal thereof connected to an intermediate point of said plurality of resistors, and a second input terminal thereof connected to a output terminal thereof.

5. A transconductance amplifier according to claim 1, wherein said voltage generating circuit comprises:
a voltage generator for outputting the common voltage; and
a non-inverting amplifier that outputs the tuning voltage with an input terminal thereof connected to the output terminal of said voltage generator.

6. A transconductance amplifier according to claim 5, wherein said voltage generator comprises:
a fifth MOS transistor that operates in triode region and is source grounded;
a sixth MOS transistor that operates in saturation region with a source terminal thereof connected to a drain terminal of said fifth MOS transistor and a drain terminal thereof connected to a gate terminal of said fifth MOS transistor; and
a current source for outputting a current to a drain terminal of said sixth MOS transistor, wherein
the gate terminal of said fifth MOS transistor constitutes the output terminal of said voltage generator; and
a gate terminal of said sixth MOS transistor is connected to an output terminal of said non-inverting amplifier.

7. A transconductance amplifier according to claim 6, wherein
said fifth MOS transistor has current mirror relationship with said first and second MOS transistors, and said sixth MOS transistor has current mirror relationship with said third and fourth MOS transistors.

8. A transconductance amplifier according to claim 6 or 7, wherein said current source is variable.

9. A transconductance amplifier according to any one of claims 2-7, wherein said voltage generator is variable.

* * * * *

UNITED STATES PATENT AND TRADEMARK OFFICE
CERTIFICATE OF CORRECTION

PATENT NO. : 7,768,349 B2  
APPLICATION NO. : 12/159978  
DATED : August 3, 2010  
INVENTOR(S) : Yusuke Aiba It is certified that error appears in the above-identified patent and that said Letters Patent is hereby corrected as shown below:

On the Title Page Item (73) "Assignee: Asahi Kasei Emd Corporation," should read -- Asahi Kasei EMD Corporation --.

Signed and Sealed this

Ninth Day of November, 2010

David J. Kappos
*Director of the United States Patent and Trademark Office*